United States Patent [19]

Blessington

[11] Patent Number: 4,502,059
[45] Date of Patent: Feb. 26, 1985

[54] ELECTRICAL INTERCONNECTION SYSTEM

[75] Inventor: Daniel R. Blessington, Rochester, N.Y.

[73] Assignee: Xerox Corporation, Stamford, Conn.

[21] Appl. No.: 409,803

[22] Filed: Aug. 20, 1982

[51] Int. Cl.³ .............................................. G01D 15/16
[52] U.S. Cl. ................................ 346/140 R; 310/328
[58] Field of Search .................. 346/140 PD; 310/328

[56] References Cited
U.S. PATENT DOCUMENTS
3,880,486  4/1975  Avakian ............................ 174/68.5

FOREIGN PATENT DOCUMENTS
55-49272  4/1980  Japan ............................ 346/140 PD
55-71572  5/1980  Japan ............................ 346/140 PD
55-73570  6/1980  Japan ............................ 346/140 PD Primary Examiner—E. A. Goldberg
Assistant Examiner—Mark Reinhart
Attorney, Agent, or Firm—Bradley A. Perkins

[57] ABSTRACT

A device in which at least two separate electrical connections are made between a first member and a second member. The first member has at least two surfaces with at least one conductive element on each surface. These conductive elements are insulated from one another. The second member is mounted in an aperture of the first member. Electrically conductive regions of the second member, insulated from one another, are connected to the conductive elements of the first member.

8 Claims, 3 Drawing Figures

ELECTRICAL INTERCONNECTION SYSTEM

This invention relates generally to an ink jet printing machine, and more particularly concerns a device for making electrical interconnections therein.

One type of an ink jet printing machine has an array of small nozzles operatively associated with an electromechanical transducer defining a chamber having ink therein. Upon excitation, the electromechanical transducer varies the volume of the chamber producing a temporary increase in pressure on the ink. This forces a droplet of ink to be ejected from the corresponding nozzle. These individual droplets of ink are sprayed onto a copy sheet. One column of vertical drops is referred to as a scan. If, in forming a character, a particular space in a scan is to be left blank, the transducer associated with the appropriate nozzle remains de-energized and a droplet of ink is not ejected from the nozzle. Thus, drops of ink are deposited in appropriate positions on the copy sheet to form the desired character. Ink jet printing machines of this type are described in U.S. Pat. No. 3,683,212 issued to Zoltan in 1972; U.S. Pat. No. 3,747,120 issued to Stemme in 1973; U.S. Pat. No. 3,832,579 issued to Arndt in 1974; and U.S. Pat. No. 3,871,004 issued to Rittberg in 1975.

One of the problems in manufacturing a printing machine of this type is the difficulty in making the required number of electrical connections to the ink jet transducers where adjacent transducers are in close proximity to each other. The space required for the electrical connections is a limit on the minimum spacing between adjacent transducers. This minimum space between adjacent transducers has a limiting effect on the resolution of the ink jet printer.

Various approaches have been devised for making electrical interconnections, the following disclosures appear to be relevant:

U.S. Pat. No. 2,586,854
Patentee: W. H. Myers
Issued: Feb. 26, 1952
U.S. Pat. No. 2,902,629
Patentee: J. B. Little et al
Issued: Sept. 1, 1959
U.S. Pat. No. 3,059,152
Patentee: A. S. Khouri
Issued: Oct. 16, 1962
U.S. Pat. No. 3,880,486
Patentee: Avakian
Issued: Apr. 29, 1975

The pertinent portions of the foregoing disclosures may be briefly summarized as follows:

Myers discloses a two sided printed circuit board with an insulated ground plane therebetween. Connections may be made through apertures in the board connecting traces on opposed sides of the board. Alternately, leads passing through the apertures may be connected on opposed sides of the board.

Little et al. discloses a device which is placed in an aperture in a circuit board. When the board is dip soldered, the device allows a connection to be made between traces to the aperture on opposed sides of the board.

Khouri discloses a double sided circuit board where a device with a plurality of leads is inserted into a plurality of matching apertures in the circuit board. Connections are made between leads on the device and traces on opposed sides of the circuit board which run to the apertures.

Avakian discloses a conductive element or plug which is inserted through an aperture in a circuit board to connect traces on opposed sides of the board extending to the aperture. The plug can also be connected to other electronic components or other plugs on other circuit boards.

In accordance with one aspect of the present invention, there is provided a device for making at least two separate electrical connections. The device includes a first member having at least one aperture therein, and at least two surfaces with at least one conductive element on each surface electrically insulated from one another. In addition, there is a second member which is mounted in the aperture of the first member. The second member has at least two electrically conductive regions which are insulated from one another. One of the conductive regions on the second member is electrically connected to one of the conductive elements on the first member with the other of the conductive regions on the second member being electrically connected to the other conductive element on the first member.

Pursuant to another aspect of the present invention, there is provided an ink jet printing machine of the type having at least one nozzle for projecting a flow of ink droplets therefrom. The printing machine includes a transducer in communication with the nozzle. This transducer has at least two electrically conductive regions insulated from one another. In addition, there is a member which has at least one aperture and at least two surfaces. There is at least one conductive element on each surface of the member. These conductive elements are electrically insulated from one another. The transducer is mounted in the aperture with one of the conductive regions thereon being electrically connected to one of the conductive elements on the member. The other of the conductive regions on the transducer is electrically connected to the other conductive element on the member. Finally, means are provided, in electrical communication with the conductive elements of the member, to generate an electrical signal exciting the transducer to induce a flow of ink into the nozzle to form a droplet egressing from the nozzle.

Other aspects of the invention will become apparent as the following description proceeds and upon reference to the drawings, in which.

While the present invention will hereinafter be described in conjunction with a preferred embodiment thereof, it will be understood that it is not intended to limit the invention to this embodiment. On the contary, it is intended to cover all alternatives, modifications, and equivalents as may be included within the spirit and scope of the invention as defined by the appended claims.

Figure 1:
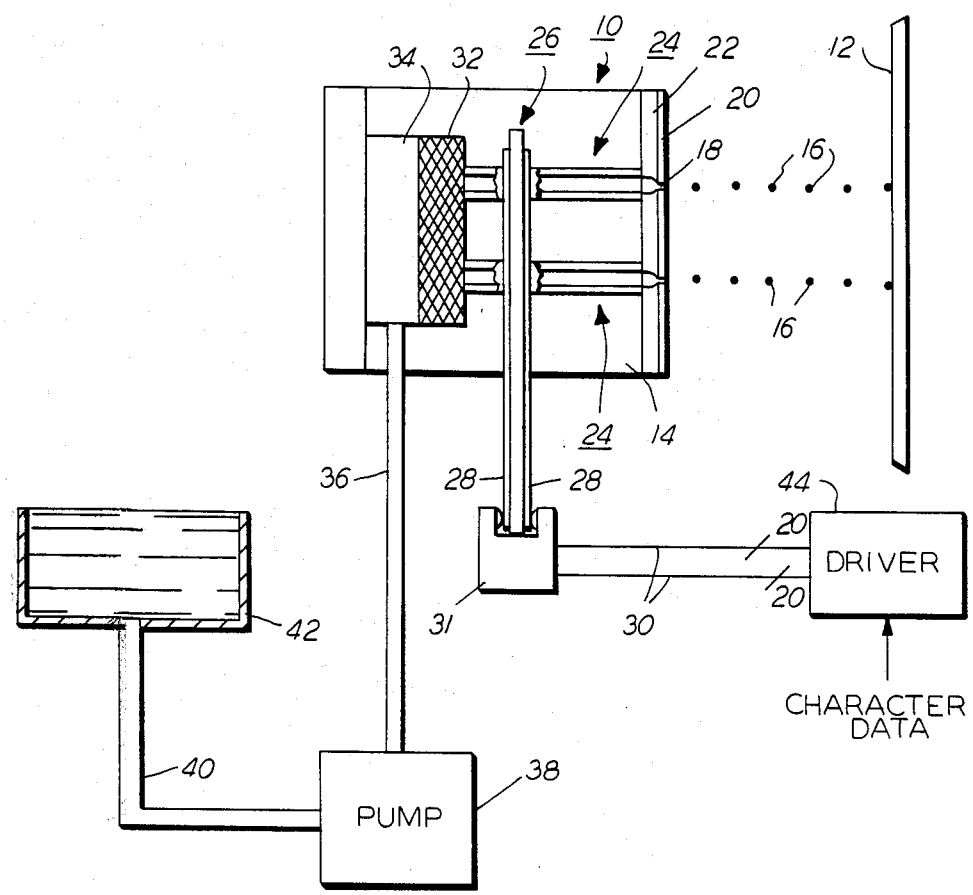
FIG. 1 is a schematic, elevational view illustrating an exemplary ink jet printing machine incorporating the features of the present invention therein.

For a general understanding of the illustrative ink jet printing machine incorporating the features of the present invention therein, reference is made to the drawings. In the drawings, like reference numerals have been used throughout to designate identical elements. FIG. 1 schematically depicts the various components of an ink jet printing machine employing the electrical interconnection system of the present invention therein. Although this interconnection system is particularly well adapted for use in the illustrative ink jet printing machine, it will become evident from the following discussion that it is equally well suited for use in a wide variety of devices and is not necessarily limited in its application to the particular embodiment shown herein.

Inasmuch as the art of ink jet printing is well known, the various components thereof employed in the FIG. 1 printing machine will be shown hereinafter schematically, and their operation described briefly with reference thereto.

Referring now to FIG. 1, there is shown an ink jet module; indicated generally by the reference numeral 10, adapted to eject droplets of writing fluid or ink therefrom. Ink jet module 10 includes an array of nozzles 18. A pair of plates 20 and 22 secured to one another and having co-linear apertures therein define nozzles 18. One end of the tubular transducers 24 abuts plate 22 with the longitudinal axis of transducer 24 being substantially co-linear with the longitudinal axis of nozzle 18. The opposed end of the transducer 24 is operatively coupled to a porous metal filter 32 hving an ink reservoir 34 adjacent thereto. Ink reservoir 34 is connected to a pump 38 by conduit 36. Conduit 40 connects pump 38 with ink supply reservoir 42. Each transducer 24 is mounted in and extends through an aperture in a double-sided circuit board 26. Transducer 24 is electrically connected, at two points, by traces 28 on opposed sides of circuit board 26. Circuit board 26 is mounted in an edge card connector 31. In this way, traces 28 on circuit board 26 are electrically connected with bus lines 30. Bus lines 30 are connected to driver 44, an electrical voltage pulse generator. Character data is fed to driver 44 which generates voltage pulses corresponding thereto. These voltage pulses are transmitted along traces 28 on circuit board 26 by bus lines 30 and edge card connector 31. Transducer 24 receives the voltage pulses from the traces 28 on circuit board 26. The voltage pulse excites transducer 24 causing it to be compressed or restricted in size. When transducer 24 rapidly compresses, in response to a voltage pulse, a droplet of ink is ejected from nozzles 18 onto a recording sheet 12. Preferably, transducer 24, the section of circuit board 26 that it is mounted in, the porous metal filter 32, and the ink reservoir 34 are encapsulated in a polymeric material 22, e.g. urethane.

Figure 2:
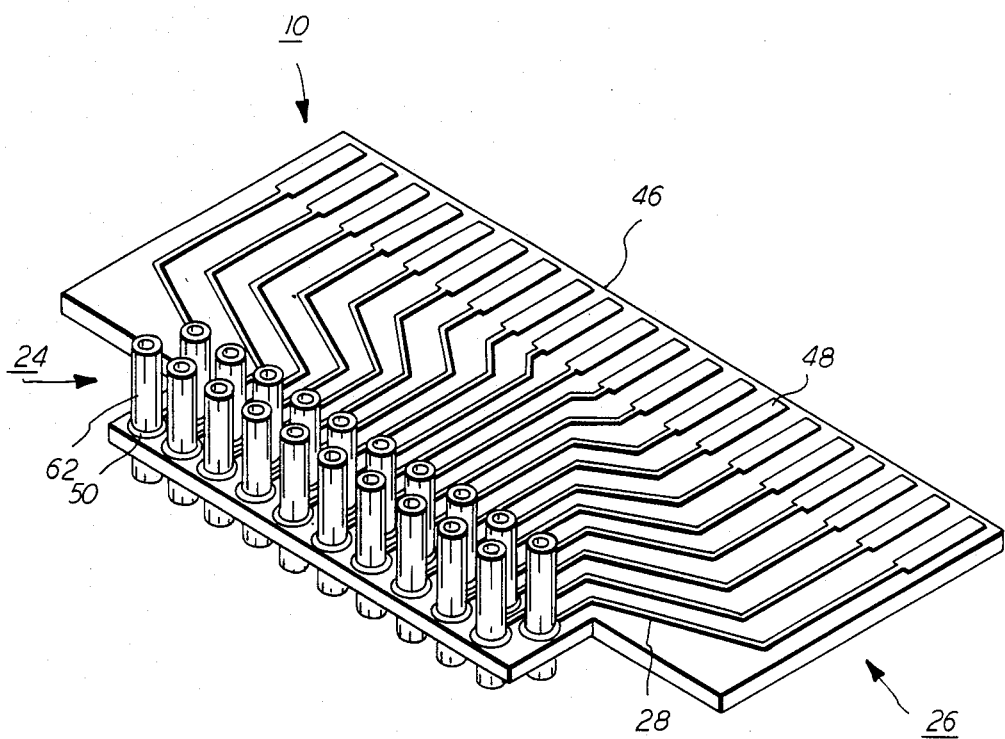
FIG. 2 is a perspective view showing a circuit board having an array of transducers mounted therein for use in the FIG. 1 printing machine.

Turning now to FIG. 2, there is shown a portion of ink jet module 10 (FIG. 1). By way of example, twenty tubular piezoelectric transducers 24 are depicted in apertures 62 in circuit board 26. Circuit board 26 consists of an insulating board 60, which forms two opposed planar surfaces. Preferably, insulating board 60 is made from an epoxy glass substrate about 0.062 inches in thickness. Traces 28 are bonded on opposed surfaces of insulating material 60. Preferably, traces 28 are made from copper, of about 0.0015 inches in thickness and having a lead-tin solder of about 0.0003 inches in thickness plated thereover. One skilled in the art will appreciate that other coatings, e.g. tin or gold, may be plated over the copper. Each aperture 62 is surrounded by a soldering pad 50. Each soldering pad 50 is connected to one of the traces 28. Traces 28 run from soldering pads 50 to edge card connector pads 48 positioned at the edge connector section 46 on insulating board 60. Edge connector section 46 is located at the edge of insulating board adjacent edge connector pads 48. Edge connector section 46 is mounted in edge card connector 31 (FIG. 1). Soldering pads 50, traces 28, and edge connector pads 48 are duplicated (not shown) on the other side of insulating board 60. Transducers 24 are mounted in apertures 62 using a precision fixture and soldered to pads 50. In this way, the circuit board serves as an electrical interconnect and as a precision alignment device for the transducers. By way of example, the electrical connection could be accomplished using a low melt solder alloy chosen so that the heat of soldering will not depole the transducers. The solder may be applied to the circuit board during fabrication by a dip technique. Alternatively, soldering may be accomplished using solder cream, solder performs, or other standard methods well known to those skilled in the art.

Figure 3:
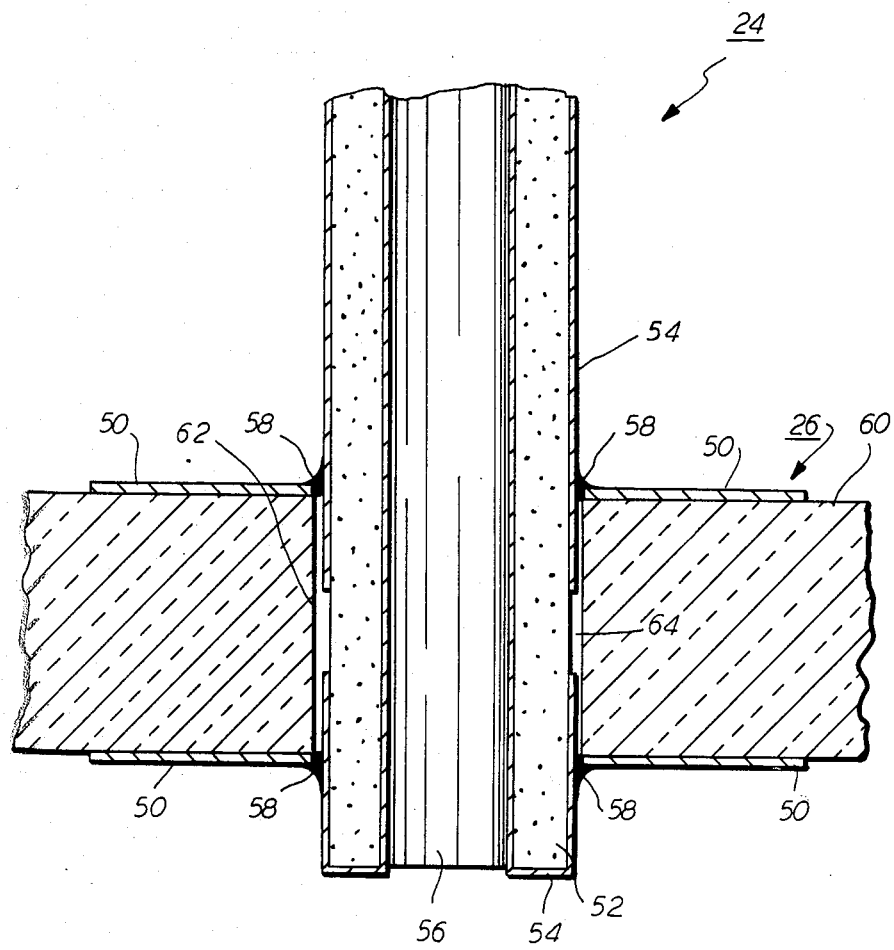
FIG. 3 is a fragmentary, sectional view depicting one of the FIG. 2 transducers mounted in an aperture in the circuit board.

FIG. 3 is a cross sectional view exemplifying a transducer 24 mounted in an aperture 62 in circuit board 26. The mounting arrangement of all the transducers in the circuit board is substantially identical thereto. A soldering pad 50, on insulating board 60, surrounds aperture 62 on opposed surfaces of board 60. Transducer 24 defines an open-ended interior chamber 56 for holding ink therein. Preferably, transducer 24 is made from a piezoelectric material having an electrically conductive material 54 coated thereover to form an electrode thereon. Conductive material 54 extends over the exterior and interior surface of piezoelectric material 52, exclusive of insulating region 64 extending around the exterior circumferential surface thereof. Insulating region 64 is not covered with conductive material 54. Another section not covered by conductive material 54 is the exterior end surface (not shown) of transducer 24 opposed from end surface 53. In this way, conductive region 54 (a) is electrically insulated by region 64 from conductive region 54 (b). Surface 59 of circuit board 26 defines a plane which intersects transducer 24 in a region covered by conductive material 54 (a). Solder 58 on this plane electrically connects conductive material 54 (a) to solder pad 50. Surface 61 of circuit board 26, similarly, defines a plane which intersects transducer 24 in a region covered by conductive material 54 (b). Insulated region 64 of transducer 24 is located between these two planes. An electrical signal transmitted along traces 28 (FIG. 2) on surface 59 is applied to conductive material 54 (a) with a signal transmitted along traces 28 (FIG. 2) on surface 61 being applied to conductive material 54 (b). In this way, a voltage potential may be applied between conductive material 54 (a) and 54 (b). This voltage potential changes the volume of piezoelectric material 52 reducing the volume of chamber 56 creating the necessary pressure to eject a droplet of ink from nozzle 18 (FIG. 1).

While the present invention has been described in reference to making electrical interconnections between an array of transducers and a circuit board in an ink jet printing machine, one skilled in the art will appreciate that this interconnect system may be equally well employed for the interconnection of other electronic devices.

In recapitulation, it is evident that the device of the present invention makes at least two separate electrical connections. Tubular piezoelectric transducers having two conductive regions are mounted in apertures in a circuit board. The circuit board has conductive traces on opposed surfaces thereof that are electrically connected to the transducers. The traces are also electrically connected to a driver which provides voltage pulses in accordance with the character data received. These voltage pulses are transmitted to the transducer changing the volume of the piezoelectric material, thereby reducing the interior volume of the transducer. This reduction in volume causes a droplet of ink to be ejected through a nozzle onto a recording sheet.

It is, therefore, evident that there has been provided in accordance with the present invention, a device for making at least two separate electrical connections which fully satisfies the aims and advantages hereinbefore set forth. While this invention has been described in conjunction with a specific embodiment thereof, it will be evident that many alternatives, modifications and variations will be apparent to those skilled in the art. Accordingly, it is intended to embrace all such alternatives, modifications and variations as fall within the spirit and broad scope of the appended claims.

What is claimed is:

1. An ink jet printing machine of the type having at least one nozzle for projecting a flow of ink droplets therefrom, wherein the improvement includes:

a transducer in communication with said nozzle, said transducer having at least two electrically conductive regions electrically insulated from one another;

a planar member having at least one aperture extending therethrough, said planar member having at least two spaced opposing planar surfaces with at least one conductive element on each opposing planar surface electrically insulated from the other;

said transducer being mounted through said aperture of said planar member, and having one of said conductive regions thereof electrically connected with one of said conductive elements of said planar member, and the other of said conductive regions thereof electrically connected with the other of said conductive elements of said planar member so as to provide a separate electrical connection from both said conductive elements on said opposing surfaces of said planar member to each of said two conductive regions of said transducer; and means, in electrical communication with both said conductive elements of said planar member, for generating an electrical signal which excites said transducer to eject a droplet of ink from said nozzle.

2. A device according to claim 1, wherein said planar member is a circuit board and said conductive elements are traces thereon extending to said aperture therein.

3. A device according to claim 1, wherein said planar member comprises a circuit board having a plurality of closely adjacent apertures therein with said conductive elements being traces thereon which extend to the periphery of each of said plurality of apertures therein for mounting a corresponding plurality of transducers.

4. A device according to claims 2 or 3, wherein said transducer is adapted to be mounted in said aperture of said circuit board with one of said conductive regions thereof being electrically connected to one of said traces on one of said opposing planar surfaces of said circuit board and the other of said conductive regions being electrically connected to the other of said traces on the other opposing planar surface thereof.

5. A device according to claim 4, wherein each said transducer is mounted to said circuit board, extending from both sides of said aperture in said circuit board so that a first plane defined by one of said opposing planar surfaces of said circuit board extends through one of said conductive regions of said transducer and a second plane defined by the other of said opposing planar surfaces of said circuit board extends through the other of said conductive regions of said transducer.

6. A device according to claims 1, 2, or 3 wherein said conductive regions of said transducer are electrically separated by a gap of a thickness less than said space between said opposing planar members, said transducer is mounted through said planar member so that said gap is aligned between said opposing planar surfaces and there is provided adjacent electrical connections between each said conductive regions on said transducer and said conductive elements on said planar member.

7. A device according to claim 6, further comprising electrical connecting means for electrically connecting each said conductive regions on said transducer to said conductive elements on said planar member and also for mechanically mounting said transducer in said aperture.

8. A device according to claim 7, wherein said electrical connecting means is solder.

* * * * *